(12) United States Patent
Uto et al.

(10) Patent No.: US 10,658,537 B2
(45) Date of Patent: May 19, 2020

(54) METHOD FOR MANUFACTURING PHOTOELECTRIC CONVERSION DEVICE

(71) Applicant: Kaneka Corporation, Osaka (JP)

(72) Inventors: Toshihiko Uto, Osaka (JP); Masashi Yoshimi, Osaka (JP)

(73) Assignee: KANEKA CORPORATION, Osaka (JP)

(*) Notice: Subject to any disclaimer, the term of this patent is extended or adjusted under 35 U.S.C. 154(b) by 0 days.

(21) Appl. No.: 16/016,353

(22) Filed: Jun. 22, 2018

(65) Prior Publication Data

US 2018/0301582 A1    Oct. 18, 2018

Related U.S. Application Data

(63) Continuation of application No. PCT/JP2016/086250, filed on Dec. 6, 2016.

(30) Foreign Application Priority Data

Dec. 24, 2015    (JP) .................................. 2015-252699

(51) Int. Cl.
*H01L 31/0747*    (2012.01)
*H01L 31/20*    (2006.01)
*H01L 31/18*    (2006.01)

(52) U.S. Cl.
CPC ...... *H01L 31/0747* (2013.01); *H01L 31/1804* (2013.01); *H01L 31/186* (2013.01);
(Continued)

(58) Field of Classification Search
CPC ..... H01L 31/186–1872; H01L 21/3003; H01L 21/202; Y02E 10/547
See application file for complete search history.

(56) References Cited

U.S. PATENT DOCUMENTS

| 5,635,408 A | 6/1997 | Sano et al. |
| 2002/0059726 A1* | 5/2002 | Sawada ................. H01L 31/076 29/890.033 |
| 2013/0210185 A1* | 8/2013 | Yoshimi .............. H01L 31/1804 438/57 |

FOREIGN PATENT DOCUMENTS

| DE | 102011052480 A1 | 2/2013 |
| JP | H07-297430 A | 11/1995 |

(Continued)

OTHER PUBLICATIONS

International Preliminary Report on Patentability issued in International Application No. PCT/JP2016/086250 (10 pages).
(Continued)

*Primary Examiner* — Charles D Garber
*Assistant Examiner* — Alia Sabur
(74) *Attorney, Agent, or Firm* — Osha Liang LLP (57) ABSTRACT

In manufacturing a crystalline silicon-based solar cell having an intrinsic silicon-based thin film and a conductive silicon-based thin film in this order on a conductive single-crystalline silicon substrate, plasma treatment is performed after the intrinsic silicon-based thin film is formed on the conductive single-crystalline silicon substrate. In the plasma treatment, a surface of the intrinsic silicon-based thin film is exposed to hydrogen plasma while a hydrogen gas and silicon-containing gases are being introduced into a CVD chamber. The amount of the hydrogen introduced into the CVD chamber during the plasma treatment is 150 to 2500 times the introduction amount of the silicon-containing gases.

19 Claims, 3 Drawing Sheets

(52) U.S. Cl.
CPC ........ *H01L 31/1876* (2013.01); *H01L 31/202* (2013.01); *Y02E 10/50* (2013.01); *Y02P 70/521* (2015.11)

(56) References Cited

FOREIGN PATENT DOCUMENTS

| | | | |
|---|---|---|---|
| JP | 2841335 B2 | 12/1998 | |
| JP | 2013-236020 A | 11/2013 | |
| JP | 2014-072406 A | 4/2014 | |
| JP | 2014072406 A * | 4/2014 | |
| WO | WO-2009015213 A1 * | 1/2009 | ....... H01L 31/03921 |
| WO | 2012/043124 A1 | 4/2012 | |
| WO | 2012/085155 A2 | 6/2012 | |
| WO | 2013021298 A2 | 2/2013 | |

OTHER PUBLICATIONS

International Search Report issued in International Application No. PCT/JP2016/086250, dated Feb. 14, 2017 (2 pages).
Extended European Search Report issued in corresponding European Application No. 16878350.4; dated Jul. 26, 2019 (7 pages).

* cited by examiner

METHOD FOR MANUFACTURING PHOTOELECTRIC CONVERSION DEVICE

TECHNICAL FIELD

One or more embodiments of the present invention relate to a method for manufacturing a crystalline silicon-based photoelectric conversion device having a heterojunction on a surface of a single-crystalline silicon substrate.

BACKGROUND

As a solar cell with high conversion efficiency, a heterojunction solar cell having an amorphous silicon thin-film on a surface of a single-crystalline silicon substrate is known. In a heterojunction solar cell, an intrinsic silicon-based thin-film is inserted between a single-crystalline silicon substrate and a conductive silicon-based thin-film to attain a passivation effect such as termination of defects (mainly dangling bonds of silicon) present on a surface of the crystalline silicon substrate with hydrogen. Thus, carrier recombination on the surface of the crystalline silicon substrate is suppressed, so that photoelectric conversion efficiency can be improved.

A method has been proposed in which a surface of a crystalline silicon substrate or an intrinsic silicon-based thin-film formed thereon is exposed to hydrogen plasma (hydrogen plasma treatment) for the purpose of further improving the conversion efficiency of a heterojunction solar cell. For example, Patent Document 1 suggests that before an amorphous silicon-based thin-film is formed on a crystalline silicon substrate, a surface of the crystalline silicon substrate is subjected to a hydrogen plasma treatment to clean the substrate surface.

Patent Document 2 suggests a method in which an intrinsic amorphous silicon thin-film having a thickness of 1 to 10 nm is formed on a crystalline silicon substrate, and then a hydrogen plasma treatment is followed by formation of a remain thickness portion of the intrinsic amorphous silicon thin-film. When an intrinsic amorphous silicon thin-film is formed in a part of the total thickness, and a hydrogen plasma treatment is then performed as described above, a surface of a crystalline silicon substrate is exposed to hydrogen plasma through the silicon thin-film, and therefore defects on the substrate surface can be cleaned off while plasma damage to the surface of the crystalline silicon substrate is suppressed.

However, when the intrinsic amorphous silicon thin-film is subjected to a hydrogen plasma treatment, the surface of the amorphous silicon film may be etched and damaged depending on the condition of the plasma treatment. Patent Document 3 and Patent Document 4 suggests that a hydrogen plasma treatment is performed not only after formation of an intrinsic amorphous silicon thin-film in a part of the total thickness, but also after the entire thickness portion of the intrinsic amorphous silicon thin-film is formed and before formation of a conductive silicon thin-film.

Patent Document 3 suggests that when a hydrogen plasma treatment is performed after formation of the entire thickness portion of the intrinsic amorphous silicon thin-film, the interface subjected to the hydrogen plasma treatment is restored, so that the film quality of the whole intrinsic amorphous silicon thin-film is improved, and therefore further improvement of conversion efficiency can be expected. Patent Document 4 suggests that not only a passivation effect is attained by a hydrogen plasma treatment, but also the passivation effect is improved by performing chemical vapor deposition (CVD) while introducing hydrogen in an amount of 2 to 6 times the amount of a source gas such as silane during formation of the intrinsic amorphous silicon thin-film.

PRIOR ART DOCUMENTS

Patent Documents

Patent Document 1: Japanese Patent No. 2841335
Patent Document 2: International Publication No. WO 2012/043124
Patent Document 3: Japanese Patent Laid-open Publication No. 2014-72406
Patent Document 4: International Publication No. WO 2012/085155

In manufacturing of a heterojunction solar cell, a silicon-based thin-film is deposited on a single-crystalline silicon substrate by plasma-enhanced CVD. In mass production of crystalline silicon-based solar cells, commonly a plurality of silicon substrates are mounted on a deposition tray and a silicon-based thin-film is deposited by plasma-enhanced CVD. A hydrogen plasma treatment during or after deposition of a silicon-based thin-film can be performed with a deposition tray set in a CVD chamber for deposition of a silicon-based thin-film.

As disclosed in Patent Documents 2 to 4, improvement of the conversion efficiency of a heterojunction solar cell by reduction of defects at the interface or improvement of film quality can be expected when a hydrogen plasma treatment is performed after deposition of an intrinsic silicon-based thin-film on a single-crystalline silicon substrate. In particular, when the power density during the hydrogen plasma treatment is increased, the film quality improving effect tends to be improved. However, when a hydrogen plasma treatment is performed on a plurality of silicon substrates mounted on a deposition tray, a difference in position of the silicon substrate in a CVD chamber may cause a variation in conversion characteristics, particularly in open circuit voltage ($V_{OC}$), and this tendency becomes marked as the power density during the hydrogen plasma treatment increases.

In particular, when deposition is continuously performed in a plurality of batches while deposition trays are replaced without carrying out maintenance of the inside of a CVD chamber, a difference in conversion characteristics between a cell obtained by performing deposition and a hydrogen plasma treatment on a substrate disposed at the central portion of the tray and a cell obtained by performing deposition and a hydrogen plasma treatment on a substrate disposed in the vicinity of the end portion of the tray becomes marked with an increase in the number of continuous deposition batches.

When a plurality of cells are connected in series to modularize solar cells, the current of a cell showing the smallest current value is a bottleneck of the current of the module. When a plurality of cells are connected in parallel to modularize solar cells, the voltage of a cell showing the smallest voltage value is a bottleneck of the voltage of the module. That is, in a solar cell module in which a plurality of cells are connected in series and/or in parallel, module efficiency depends on a cell having the poorest characteristics. Thus, when there is a large cell characteristic variation within one batch or among batches during preparation of cells, module efficiency is considerably deteriorated.

For reducing a variation in cell characteristics within one batch or among batches, mention is made of a method in which the power density during the hydrogen plasma treatment is reduced, or in which a substrate is not disposed in the vicinity of the end portion of the deposition surface of a CVD chamber for limiting the deposition area. However, when the power density during the hydrogen plasma treatment is reduced, the film quality improving effect tends to be reduced, leading to deterioration of the conversion efficiency of the solar cell. In addition, when the deposition area is limited, the number of substrates that can be treated in one batch decreases, so that production efficiency is deteriorated. When the number of continuous deposition batches is decreased to increase the frequency of maintenance of the inside of a CVD chamber, a variation in characteristics among batches can be reduced, but the operation rate of an apparatus is reduced, so that production efficiency is considerably deteriorated.

SUMMARY

One or more embodiments of the present invention provide a method for manufacturing a heterojunction solar cell suitable for mass production, wherein conversion characteristics can be improved by a hydrogen plasma treatment of an intrinsic silicon-based thin-film, and a cell characteristic variation within one batch and among batches can be suppressed even when the number of continuous deposition batches is increased.

One or more embodiments of the present invention relate to a method for manufacturing a crystalline silicon-based solar cell including an intrinsic silicon-based thin-film and a conductive silicon-based thin-film in this order on one principal surface of a conductive single-crystalline silicon substrate. After deposition of the intrinsic silicon-based thin-film, the surface of the silicon-based thin-film is exposed to hydrogen plasma by a plasma treatment. When a silicon-containing gas is included in an atmosphere during the plasma treatment, high conversion characteristics can be exhibited, and a variation in cell characteristics can be suppressed even when the number of continuous deposition batches increases.

In the method for manufacturing a crystalline silicon-based solar cell according to one or more embodiments of the present invention, a plasma treatment is performed. In the plasma treatment, the surface of an intrinsic silicon-based thin-film is exposed to hydrogen plasma with a hydrogen gas and silicon-containing gas being introduced into a CVD chamber in a state where a plurality of substrates with an intrinsic silicon-based thin-film provided on a conductive single-crystalline silicon substrate are disposed in the CVD chamber. The amount of hydrogen introduced into the CVD chamber during the plasma treatment is 150 to 2500 times the introduction amount of the silicon-containing gas.

In one or more embodiments, the power density during the plasma treatment may be 55 to 1000 mW/cm². The product of the power density during the plasma treatment and the ratio of the introduction amount of the hydrogen gas to the introduction amount of the silicon-containing gas may be 15000 to 250000 mW/cm².

In one or more embodiments, the deposition rate of the intrinsic silicon-based thin-film in the plasma treatment may be −0.14 nm/second to +0.08 nm/second. The negative sign of the deposition rate during the plasma treatment means etching (decrease in thickness), and the positive sign means deposition (increase in thickness).

In one or more embodiments, the difference $d_1-d_0$ between the thickness $d_1$ of the intrinsic silicon-based thin-film after the plasma treatment and the thickness $d_0$ of the intrinsic silicon-based thin-film before the plasma treatment may be −3 nm to +1.5 nm. The value of $(d_1-d_0)/d_1$ may be −0.4 to +0.2.

In one or more embodiments, the intrinsic silicon-based thin-film is formed by plasma-enhanced CVD with a silicon-containing gas being introduced into a CVD chamber. For forming the intrinsic silicon-based thin-film, hydrogen may be introduced into the CVD chamber in addition to the silicon-containing gas. The amount of hydrogen introduced into the CVD chamber during formation of the intrinsic silicon-based thin-film may be less than 50 times the introduction amount of the silicon-containing gas. The deposition rate of the intrinsic silicon-based thin-film may be 0.1 nm/sec or more in terms of a value calculated as a deposition rate on a smooth surface. It may be possible that deposition of the intrinsic silicon-based thin-film and the plasma treatment are performed in the same CVD chamber.

In one or more embodiments, formation of the intrinsic silicon-based thin-film may be divided into a plurality of times of sublayer deposition. When the formation of the intrinsic silicon-based thin-film is divided into deposition of n sublayers including first to $n^{th}$ sublayers in this order from the conductive single-crystalline silicon substrate side, the plasma treatment is performed after deposition of any one of the sublayers. In particular, it may be possible that the plasma treatment is performed after deposition of the first sub layer and after deposition of the $n^{th}$ sublayer.

In one or more embodiments, n is an integer of 2 or more. For example, when n is 2, the first intrinsic thin-film is formed by depositing the first sublayer and the second sublayer. In one or more embodiments, each of the sublayers is deposited to have a thickness of 1 to 8 nm. In particular, it may be possible that the first sublayer which is in contact with the silicon substrate is deposited to have a thickness of 1 to 6 nm.

According to the method of one or more embodiments of the present invention, a crystalline silicon-based solar cell with high conversion efficiency can be obtained. In addition, even when the number of continuous deposition batches of silicon-based thin-films is increased, the cell characteristic variation within one batch and among batches is small, so that the quality of the cell can be stabilized. Thus, the frequency of maintenance of the inside of a CVD chamber can be reduced to improve the production efficiency of the solar cell. Further, since the cell characteristic variation is small, module characteristics can be improved when a solar cell module is prepared by electrically connecting a plurality of cells.

DETAILED DESCRIPTION OF THE EMBODIMENTS

Figure 1:
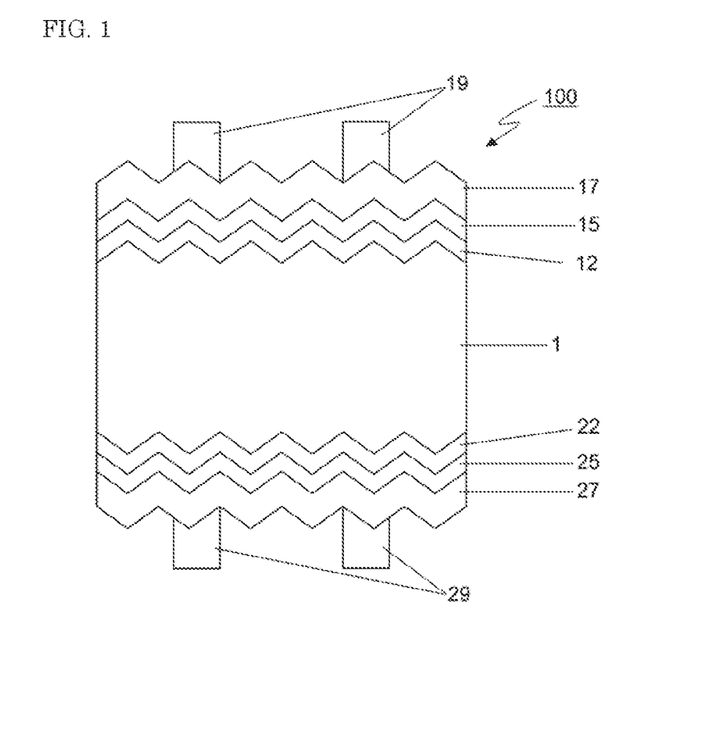
FIG. 1 is a schematic sectional view showing one embodiment of a crystalline silicon-based solar cell.

FIG. 1 is a schematic sectional view showing one embodiment of a crystalline silicon-based solar cell. A solar cell 100 in FIG. 1 includes intrinsic silicon-based thin-films 12 and 22 and conductive silicon-based thin-films 15 and 25 in this order on a first principal surface (p-layer side) and a second principal surface (n-layer side), respectively, of the silicon substrate 1. The conductive silicon-based thin-film 15 on the first principal surface and the conductive silicon-based thin-film 25 on the second principal surface have different conductivity-types. In other words, the conductive silicon-based thin-film 15 on the first principal surface is p-type, and the conductive silicon-based thin-film 25 on the second principal surface is n-type. Transparent electroconductive layers 17 and 27 and metal electrodes 19 and 29 are formed on the conductive silicon-based thin-films 15 and 25, respectively.

The silicon substrate 1 is an n-type or p-type conductive single-crystalline silicon substrate. In general, an electron has a higher mobility than a hole. Thus, when the silicon substrate 1 is an n-type single-crystalline silicon substrate, the conversion characteristics of the solar cell may be improved. A light-receiving surface of the solar cell 100 may be either on the p-layer side or on the n-layer side. In the heterojunction solar cell, when a heterojunction on the light-receiving side is a reverse junction, a strong electric field is formed, so that photoproduction carriers (electrons and holes) can be efficiently separated and recovered. Thus, when the silicon substrate has n-type conductivity it may be possible that the light-receiving surface is on the p-layer side. When a patterned metal electrode is provided on each of both transparent electroconductive layers as shown in FIG. 1, both the surfaces on the p-layer side and the n-layer side may be a light-receiving surface.

From a viewpoint of light confinement, a texture (uneven structure) may be formed on a surface of the silicon substrate 1. The single-crystalline silicon substrate may have plane orientation of (100) plane in order to form a texture on its surface. This is because when the single-crystalline silicon substrate is etched, a textured surface structure is easily formed by anisotropic etching that exploits the difference in etching rate between the (100) plane and the (111) plane.

The intrinsic silicon-based thin-films 12 and 22 and the conductive silicon-based thin-films 15 and 25 are thin-films composed of a silicon-based material. Since the intrinsic silicon-based thin-films 12 and 22 are disposed between the single-crystalline silicon substrate 1 and the conductive silicon-based thin-films 15 and 25, respectively, a surface of the silicon substrate is effectively passivated. For improving the passivation effect on the surface of the silicon substrate, the intrinsic silicon-based thin-films 12 and 22 may be non-doped hydrogenated silicon substantially composed of silicon and hydrogen. Examples of the silicon-based material include silicon alloys such as silicon carbide, silicon nitride and silicon germanium in addition to silicon.

Although the method for forming a silicon-based thin-film is not particularly limited, a plasma-enhanced CVD may be used. When a silicon-based thin-film is deposited by plasma-enhanced CVD, deposition of a silicon-based thin-film and a plasma treatment can be performed in the same chamber, so that the process can be simplified.

In one or more embodiments, a source gas used for deposition of the silicon-based thin-films by plasma-enhanced CVD may be a silicon-containing gas such as $SiH_4$ or $Si_2H_6$. A source gas diluted with, for example, a hydrogen gas ($H_2$) may be introduced to a chamber. A dopant gas for forming the conductive (p-type or n-type) silicon-based layer may be, for example, $B_2H_6$ or $PH_3$. In one or more embodiments, the amount of impurity such as P or B added is sufficient to be a trace amount; thus, a mixed gas wherein a dopant gas is beforehand diluted with the source gas, $H_2$ or the like may be used. In one or more embodiments, a gas containing a different element, such as $CH_4$, $CO_2$, $NH_3$ or $GeH_4$, may be added to the aforementioned gas to form a silicon alloy thin-film, such as silicon carbide, silicon nitride and silicon germanium, as the silicon-based layer. Deposition conditions for forming the silicon-based thin-films by a plasma-enhanced CVD method may be as follows: a substrate temperature of 100 to 300° C.; a pressure of 20 to 2600 Pa; and a high-frequency power density of 3 to 500 $mW/cm^2$.

[Deposition of Silicon-Based Thin-Film and Plasma Treatment on Silicon Substrate]

In the manufacturing method of one or more embodiments of the present invention, a deposition surface of any one of the intrinsic silicon-based thin-film 12 on the first principal surface of the silicon substrate 1 and the intrinsic silicon-based thin-film 22 on the second principal surface of the silicon substrate 1 is subjected to a plasma treatment. The plasma treatment is performed in a silicon-containing hydrogen atmosphere with a hydrogen gas and silicon-containing gas being introduced into a CVD chamber. Hereinafter, formation of the intrinsic silicon-based thin-film 12 on the first principal surface of the silicon substrate 1, and a plasma treatment will be described.

<Deposition of Intrinsic Silicon-Based Thin-Film>

In one or more embodiments, the intrinsic silicon-based thin-film 12 is deposited by plasma-enhanced CVD. In deposition of the intrinsic silicon-based thin-film by plasma-enhanced CVD, the silicon substrate is introduced into a chamber of a plasma-enhanced CVD apparatus at the set out. A plurality of silicon substrates may be mounted on a mounting member such as a deposition tray and introduced into the chamber. In addition, the silicon substrate may be fixed at a predetermined position in the chamber by a suction method or the like. By introducing a plurality of silicon substrates into the chamber, and performing deposition on a plurality of silicon substrates in one batch, the production efficiency of the solar cell can be improved.

In one or more embodiments, after introduction of the silicon substrate into the chamber, the substrate is heated as necessary. Thereafter, a silicon-containing gas and a diluting gas such as hydrogen as necessary are introduced into the chamber, and the intrinsic silicon-based thin-film 12 is deposited on the silicon substrate 1.

The intrinsic silicon-based thin-film 12 is a layer adjacent to the silicon substrate 1, and acts as a passivation layer on a surface of the silicon substrate. For effectively passivating the surface, the intrinsic silicon-based thin-film 12 may be amorphous at an initially deposited portion in the vicinity of the interface with the silicon substrate 1. Thus, it may be possible that the intrinsic silicon-based thin-film is deposited at a high rate. The deposition rate of the intrinsic silicon-based thin-film may be 0.1 nm/second or more, 0.15 nm/second or more, or 0.2 nm/second or more. By increasing the deposition rate, epitaxial growth of silicon is suppressed, so that an amorphous film is easily formed.

Since a substrate with a texture formed on a surface thereof has a larger surface area as compared to a smooth substrate having no texture, the deposition rate on a substrate provided with a texture is lower than the deposition rate on a smooth surface. The deposition rate is determined as a value calculated in terms of a deposition rate on a smooth surface. On a silicon substrate without a texture, a glass plate or the like, a film is deposited for a predetermined period of time under the same condition, the thickness of the film is measured by spectroscopic ellipsometry, and the deposition rate on the smooth surface can be calculated from the measured thickness. The thickness of a thin-film on a silicon substrate provided with a texture is a thickness in a direction perpendicular to the slope of the texture and can be determined by observing a cross-section with a transmission electron microscope (TEM).

The deposition rate tends to be increased, in one or more embodiments, by decreasing the introduction amount of hydrogen (dilution ratio with hydrogen) during deposition of the intrinsic silicon-based thin-film. The introduction amount of hydrogen during deposition of the intrinsic silicon-based thin-film may be less than 50 times the introduction amount of the silicon-containing gas. The introduction amount of hydrogen may be not more than 20 times, not more than 10 times, or not more than 6 times the introduction amount of the silicon-containing gas. The intrinsic silicon-based thin-film may be deposited without introducing hydrogen. By adjusting the process pressure, power density and the like during deposition, the deposition rate can be increased.

In one or more embodiments, the intrinsic silicon-based thin-film 12 is deposited to have a thickness of 3 nm to 15 nm. The deposition thickness $d_0$ of the f intrinsic silicon-based thin-film is a thickness before plasma treatment is performed. The deposition thickness of the intrinsic silicon-based thin-film may be 3.5 nm to 12 nm, or 4 nm to 10 nm. When the deposition thickness of the intrinsic silicon-based thin-film is excessively small, the passivation effect on the single-crystalline silicon substrate tends to be insufficient, or a surface of the silicon substrate tends to be susceptible to plasma damage during plasma treatment of the intrinsic silicon-based thin-film. The deposition thickness of the intrinsic silicon-based thin-film may be 10 nm or less, or 8 nm or less. When the thickness of the intrinsic silicon-based thin-film is excessively large, conversion characteristics tend to be deteriorated due to light absorption by the intrinsic silicon-based thin-film or electrical loss resulting from an increased resistance.

<Plasma Treatment>

A plasma treatment is performed with a hydrogen gas and silicon-containing gas being introduced into a CVD chamber in a state where a plurality of substrates with the intrinsic silicon-based thin-film 12 provided on the silicon substrate 1 are disposed in the CVD chamber. The conversion characteristics of the solar cell, especially the open circuit voltage (Voc) and fill factor (FF) tend to be improved by exposing the surface of the intrinsic silicon-based thin-film to hydrogen plasma in the plasma treatment. In one or more embodiments of the present invention, a silicon-containing gas such as silane is introduced into a CVD chamber in addition to hydrogen in the plasma treatment, so that a characteristic variation within one batch and among batches is suppressed even when the number of continuous deposition batches increases.

(Hydrogen Plasma Treatment in Conventional Technique)

Figure 2A:
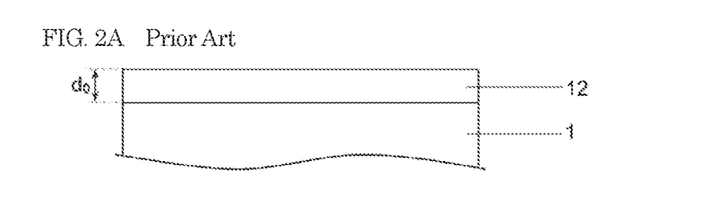
FIGS. 2A and 2B are conceptual views for explaining a hydrogen plasma etching in a conventional technique.
Figure 2B:
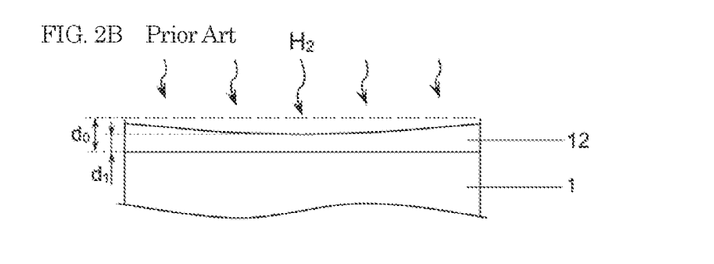

FIGS. 2A and 2B are conceptual views showing an outline of a common hydrogen plasma treatment in a conventional technique. First, the intrinsic silicon-based thin-film 12 having a thickness do is formed on a principal surface of the silicon substrate 1 (FIG. 2A). Thereafter, plasma discharge is performed with hydrogen being introduced into a CVD chamber, and resultantly the surface of the intrinsic silicon-based thin-film 12 is exposed to hydrogen plasma so that the thickness is decreased by hydrogen plasma etching (FIG. 2B).

In common hydrogen plasma etching, a hydrogen gas, or a mixed gas of a hydrogen gas and an inert gas is used. When the plasma power density during hydrogen plasma etching is increased, the passivation effect by hydrogen plasma tends to be improved. As a result of studies by the present inventors, on the other hand, it has been found that when hydrogen plasma treatment is performed at a high power density, the conversion characteristics of the solar cell tend to vary depending on a position (deposition position) of the silicon substrate in a chamber, leading to occurrence of a cell characteristic variation within one batch. It has been found that in particular, when deposition is continuously performed in a plurality of batches while silicon substrates are replaced without carrying out maintenance of the inside of a CVD chamber, a variation in conversion characteristics tends to increase with an increase in the number of continuous deposition batches.

As a result of further conducting studies, it has been found that the thickness of the intrinsic silicon-based thin-film after hydrogen plasma etching tends to be smaller on a substrate disposed in the vicinity of the center of the deposition surface in a chamber (substrate mounted in the vicinity of the center of a deposition tray) than on a substrate disposed at the end portion of the deposition surface (substrate mounted at the end portion of the deposition tray).

The thickness of the intrinsic silicon-based thin-film after hydrogen plasma etching is relatively small in the vicinity of the center in the chamber. This phenomenon may be associated with the relatively large amount of plasma etching in the vicinity of the center in the chamber. This state is schematically shown in FIG. 2B. The broken line in FIG. 2(B) shows the intrinsic silicon-based thin-film 12 before hydrogen plasma etching.

The phenomenon in which the plasma etching amount in the vicinity of the center is relatively large may be ascribable to the influence of a plasma intensity distribution in the deposition surface. During deposition of the silicon-based thin-film, the plasma power density is low, so that the distribution of plasma power in the deposition surface is small, leading to a small variation in deposition thickness do. On the other hand, it is considered that since hydrogen plasma etching is performed at a higher power density than that in deposition of an amorphous silicon thin-film, the plasma intensity distribution in the deposition surface increases, and the in-plane distribution of the plasma intensity causes an in-plane distribution of the plasma etching amount (distribution of the thickness of the intrinsic silicon-based thin-film after plasma etching).

In FIG. 2B, the length of the arrow corresponds to the plasma intensity, and a state is schematically shown in which the etching amount at the central portion is large because the plasma intensity at the central portion is larger than that at the end portion. For the sake of convenience, FIG. 2B schematically illustrate a distribution on one silicon substrate for simplifying illustrations of the in-plane distributions of the plasma intensity and the thickness. The same applies to FIGS. 3A. 3B, 4A, 4B, 4C, and 4D described later.

As a result of conducting studies by the present inventors, it has been found that an increase in the number of continuous deposition batches tends to expand the thickness difference in a batch, which accordingly increases a variation in conversion characteristics of the solar cells. In a deposition batch immediately after maintenance, such as cleaning, of the inside of a chamber is carried out, the variation in thickness changes due to the hydrogen plasma treatment within one batch is small because the distribution of the plasma intensity in the deposition surface is small. It is supposed that an in-plane distribution of the plasma intensity occurs such that the plasma intensity in the vicinity of the central portion is larger than that in the vicinity of the end portion as schematically shown in FIG. 2(B) due to, for example, an increase in stacking amount of a film accumulated on a chamber inner wall etc. with an increase in the number of continuous deposition batches.

It has been found that the plasma intensity distribution and the thickness distribution are small within the range of the size of one silicon substrate (e.g., about 6 inches) to be used for the solar cell, but when a plurality of silicon substrates are treated in one batch, the thickness distribution between the substrates tends to be conspicuous. It has been found that the thickness distribution between the substrates in a batch tends to increase as the number of substrates treated one time is increased with a large CVD chamber having a large deposition area. This tendency is remarkable when the deposition area is 0.3 $m^2$ or more, and this tendency is particularly remarkable when the deposition area is 0.5 $m^2$ or more.

(Hydrogen Plasma Treatment in One or More Embodiments of the Present Invention)

Figure 3A:
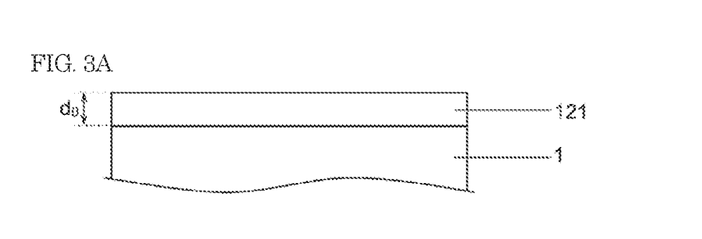
FIGS. 3A and 3B are conceptual views for explaining a plasma treatment in one or more embodiments of the present invention.
Figure 3B:
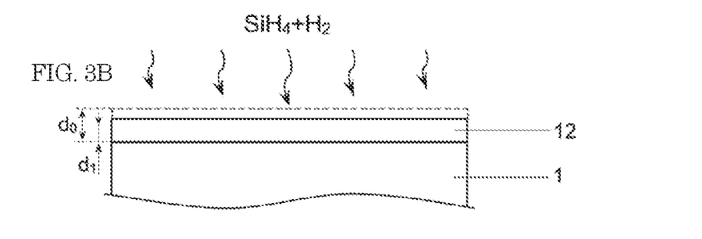

In one or more embodiments of the present invention, a plasma treatment is performed with a silicon-containing gas being introduced into a CVD chamber in addition to hydrogen. FIGS. 3A and 3B are conceptual views showing an outline of a plasma treatment in one or more embodiments of the present invention. First, the intrinsic silicon-based thin-film 12 having a thickness do is formed on a principal surface of the silicon substrate 1 (FIG. 3A). Thereafter, plasma discharge is performed with hydrogen and a silicon-containing gas being introduced into the CVD chamber to perform a plasma treatment (FIG. 3B). As the silicon-containing gas, $SiH_4$, $Si_2H_6$ or the like is used as in the case of a source gas that is used for deposition of the silicon-based thin-film.

The amount of hydrogen introduced into the CVD chamber during the plasma treatment is set to 150 to 2500 times the introduction amount of the silicon-containing gas. The ratio of the introduction amount of hydrogen to the introduction amount of the silicon-containing gas (hydrogen dilution ratio) may be 200 or more, 400 or more, or 600 or more. The atmospheric gas during the plasma treatment may contain an inert gas such as a nitrogen, helium or argon gas, and contain a very small amount of a dopant gas such as a $B_2H_6$ or $PH_3$ gas. In one or more embodiments, a plasma treatment is performed in an atmosphere having a hydrogen concentration of 80% by volume or more. The hydrogen concentration during the plasma treatment may be 90% by volume or more, or 95% by volume or more.

The substrate temperature during the plasma treatment may be 100° C. to 300° C. The pressure may be 20 Pa to 2600 Pa. From the viewpoint of improving the passivation effect by hydrogen plasma, it may be possible that the plasma treatment is performed at a high pressure with a hydrogen introduction amount larger than that during deposition of the intrinsic silicon-based thin-film. The pressure during the plasma treatment may be 100 Pa or more, 150 Pa or more, or 200 Pa or more.

From the viewpoint of improving the passivation effect by hydrogen plasma, the plasma power density may be 55 $mW/cm^2$ or more, 60 $mW/cm^2$ or more, 70 $mW/cm^2$ or more, or 80 $mW/cm^2$ or more. On the other hand, when the power density during the plasma treatment is excessively high, it may be difficult to control the thickness. In addition, when the power density is excessively high, the film quality of the intrinsic silicon-based thin-film may be deteriorated, or plasma damage to a surface of the single-crystalline silicon substrate may occur, leading to deterioration of the conversion characteristics of the solar cell. Thus, the plasma power density during hydrogen plasma treatment may be 1000 $mW/cm^2$ or less 800 $mW/cm^2$ or less 400 $mW/cm^2$ or less, or 200 $mW/cm^2$ or less.

Generally, the introduction amount of a hydrogen gas in deposition of amorphous silicon is set to not more than 10 times the amount of a silicon-containing gas. It is known that microcrystalline silicon is formed when the ratio of the introduction amount of a hydrogen gas to the amount of a silicon-containing gas (hydrogen dilution ratio) increases. Generally the hydrogen dilution ratio in deposition of microcrystalline silicon is about 30 to 100. In one or more embodiments of the present invention, a plasma treatment is performed under an atmosphere at a higher hydrogen concentration with a smaller amount of the silicon-containing gas as compared to deposition of a general silicon thin-film. Thus, in the plasma treatment in one or more embodiments of the present invention, etching of the surface of the intrinsic silicon-based thin-film by hydrogen plasma and the CVD film formation by a silicon-containing gas present in an atmosphere may competitively occur in parallel. Therefore, the rate of change in thickness (etching rate or deposition rate) by the plasma treatment is expressed by a difference between the etching rate by hydrogen plasma and the CVD film formation rate.

With an increase in the number of continuous deposition batches, an in-plane distribution of the plasma intensity occurs such that the plasma intensity in the vicinity of the central portion tends to be larger than that in the vicinity of the end portion as described above. In the plasma treatment in one or more embodiments of the present invention, the plasma etching amount (etching rate) and the amount of deposition (deposition rate) of the silicon-based thin-film by CVD may be each relatively large at a site where the plasma intensity is relatively high when an in-plane distribution of the plasma intensity occurs. Similarly, the etching rate and the deposition rate may be relatively small at a site where the plasma intensity is relatively low.

In this way by introducing a silicon containing gas during the plasma treatment, the silicon-based thin-film is formed by CVD so as to compensate for a decrease in thickness due to hydrogen plasma etching. It is thus considered that the variation in thicknesses of the intrinsic silicon-based thin-films is small, so that a variation in conversion characteristics of the solar cells can be reduced even when an in-plane distribution of the plasma intensity occurs. In addition, in the plasma treatment in one or more embodiments of the present invention, the plasma power density and the hydrogen introduction amount (hydrogen partial pressure in a CVD chamber) are equivalent to those in a conventional hydrogen plasma treatment in which a silicon-containing gas is not used, and thus the hydrogen plasma amount is equivalent to that in the conventional hydrogen plasma treatment. Thus, a high passivation effect equivalent to that in the conventional hydrogen plasma treatment can be obtained while a variation in thickness of the intrinsic silicon-based thin-film is suppressed.

In the plasma treatment in one or more embodiments of the present invention, an in-plane distribution of the plasma intensity may occur either when the thickness increases (deposition mode) and when the thickness decreases (etching mode) depending on conditions such as a gas introduction amount and a plasma power density. The deposition rate of the intrinsic silicon-based thin-film in the hydrogen plasma treatment may be −0.14 nm/second to +0.08 nm/second, −0.10 nm/second to +0.05 nm/second, for −0.07 nm/second to 0 nm/second. The negative sign of the deposition rate corresponds to an etching mode. The positive sign of the deposition rate corresponds to a deposition mode.

From the viewpoint of reducing the thickness distribution after the plasma treatment in one or more embodiments, it may be possible that the deposition rate during the plasma treatment is theoretically 0. As long as the deposition rate during the plasma treatment is within a range of about ±0.1 nm, a thickness variation that affects the characteristics of a solar cell hardly occurs. Meanwhile, when the thickness decreases during the plasma treatment, i.e., the plasma treatment is performed in an etching mode in which the deposition rate is negative, the conversion characteristics (particularly, the open circuit voltage and the fill factor) of the solar cell tends to be higher.

In one or more embodiments, Improvement of the open circuit voltage may result from improvement of the film quality of the silicon-based thin-film due to exposure to hydrogen plasma (termination of dangling bonds by introduction of hydrogen into the film), and improvement of interface characteristics. Generally when the deposition thickness of the intrinsic silicon-based thin-film is small, the passivation effect on the silicon substrate tends to be reduced, leading to a decrease in open circuit voltage of the solar cell. On the other hand, when the thickness of the intrinsic silicon-based thin-film is reduced by plasma treatment, the effect of improving film quality and improving interface characteristics may sufficiently compensate for reduction of the passivation effect due to a decrease in thickness, resulting in improvement of the open circuit voltage. In addition, improvement of the film quality of the intrinsic silicon-based thin-film and reduction of the thickness of plasma treatment may decrease series resistance by the intrinsic silicon-based thin-film, resulting in improvement of the fill factor.

In one or more embodiments, when the plasma power density is large, and the hydrogen dilution ratio is large (the introduction amount of the silicon-containing gas is small), the etching mode tends to be dominant, leading to a decrease in thickness of the intrinsic silicon-based thin-film. From the viewpoint of attaining both the passivation effect on the intrinsic silicon-based thin-film and reduction of a thickness variation, the product of the power density during the plasma treatment and the ratio of the introduction amount of the hydrogen gas to the introduction amount of the silicon-containing gas (hydrogen dilution ratio) may be 15000 to 250000 mW/cm$^2$. The product of the power density and the hydrogen dilution ratio may be 20000 to 200000 mW/cm$^2$, 30000 to 150000 mW/cm$^2$, or 40000 to 100000 mW/cm$^2$. When the product of the power density and the hydrogen dilution ratio is set within this range, the deposition rate in the plasma treatment can be adjusted within the above-mentioned range. A small product of the power density and the hydrogen dilution ratio tends to lead to a deposition mode (positive deposition rate), and a large product of the power density and the hydrogen dilution ratio tends to lead to an etching mode (negative deposition rate).

In some embodiments, the difference $d_1-d_0$ between the thickness $d_1$ of the intrinsic silicon-based thin-film after the plasma treatment and the thickness $d_0$ of the intrinsic silicon-based thin-film before the plasma treatment may be −3 nm to +1.5 nm, −2.5 nm to +0.5 nm, or −2 nm to 0 nm. When there is a variation in deposition thickness or thickness change amount during the plasma treatment, the difference $d_1-d_0$ at the central portion in the surface of the silicon substrate is defined as a thickness change amount. When a plurality of silicon substrates are treated in one batch, the average of differences $d_1-d_0$ at the central portion in the surface of the silicon substrates is defined as a thickness change amount. The deposition rate during the plasma treatment is calculated from the difference $d_1-d_0$ and the plasma treatment time.

In one or more embodiments, the ratio $(d_1-d_0)/d_1$ of the thickness change amount $d_1-d_0$ to the thickness do of the intrinsic silicon-based thin-film before the plasma treatment may be −0.4 to +0.2, −0.35 to +0.1, or −0.3 to 0. When the thickness change is excessively large, a change in film quality of the intrinsic silicon-based thin-film may increase, leading to deterioration of the passivation effect on the silicon substrate by the intrinsic silicon-based thin-film.

In one or more embodiments, the plasma treatment time may be 3 seconds or more, 5 seconds or more, or 10 seconds or more. When the plasma treatment time is in the above-mentioned range, a passivation effect of the intrinsic silicon-based thin-film by hydrogen plasma can be obtained, so that improvement of the characteristics of the solar cell can be expected. Even when the plasma processing time is excessively long, further improvement of the passivation effect cannot be expected, and the thickness distribution of the intrinsic silicon-based thin-film may increase. Thus, the plasma treatment time may be 140 seconds or less, 100 seconds or less, or 60 seconds or less.

As described above, the initially deposited portion of the intrinsic silicon-based thin-film 12 may be amorphous for improving the function as a passivation layer on a surface of the silicon substrate 1. On the other hand, a vicinity of the surface of the intrinsic silicon-based thin-film 12 may be crystallized due to an exposure to hydrogen plasma.

In one or more embodiments, after deposition of the intrinsic silicon-based thin-films, plasma treatment may be performed in the same CVD chamber without taking out the substrate. In this case, deposition of the intrinsic silicon-based thin-film and the plasma treatment may be continuously performed, or plasma discharge may be temporarily stopped. When deposition of the intrinsic silicon-based thin-film and the plasma treatment are continuously performed, the supply of the source gas may be stopped in a state where plasma discharge is continued for reducing the concentration of the silicon-containing gas in the chamber. When plasma discharge is temporarily stopped after deposition of the intrinsic silicon-based thin-film, it may be possible that a gas in the chamber is replaced in a state where plasma discharge is stopped, so that the concentration of the source gas (silicon containing gas) in the chamber is reduced, and after the inside of the chamber is brought into a gas atmosphere mainly composed of hydrogen, discharge is resumed to start the plasma treatment.

[Modification of Deposition of Silicon-Based Thin-Film and Plasma Treatment]

Although the intrinsic silicon-based thin-film 12 having a thickness do is formed by performing CVD film formation once in the embodiment shown in FIG. 3, formation of the intrinsic silicon-based thin-film 12 may be divided into a plurality of times of sublayer deposition processes. When the formation of the intrinsic silicon-based thin-film is divided into deposition of sublayers, the above-mentioned plasma treatment is performed after deposition of any one of the sublayers and before deposition of a next layer. The plasma treatment may be performed after deposition of each sublayer.

Figure 4A:
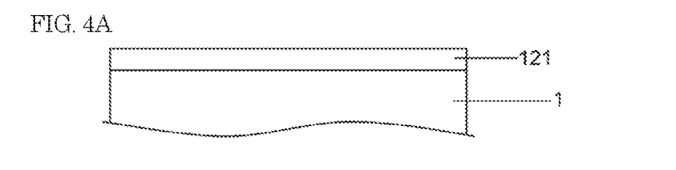
FIGS. 4A, 4B, 4C, and 4D are conceptual views for explaining a plasma treatment to an intrinsic silicon-based thin-film composed of a plurality of sublayers.
Figure 4B:
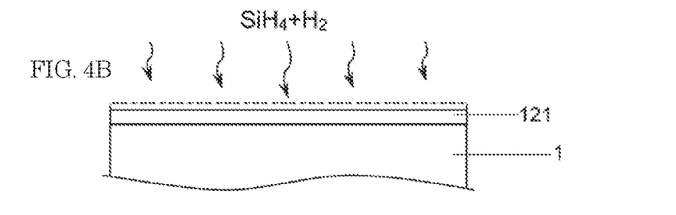
Figure 4C:
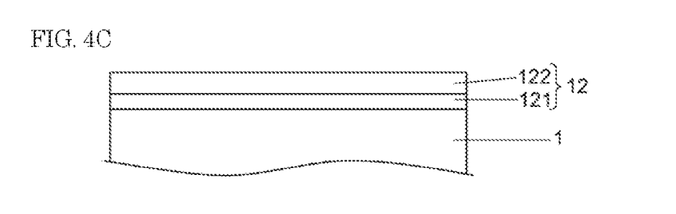
Figure 4D:
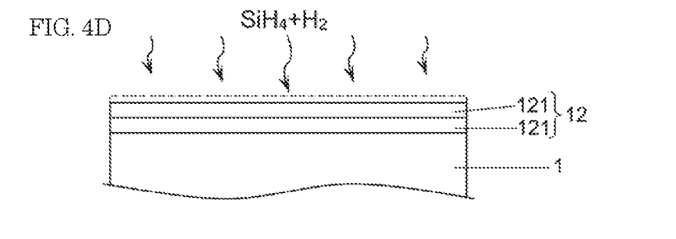

FIGS. 4A. 4B, 4C, and 4D show an embodiment in which formation of the intrinsic silicon-based thin-film 12 is divided into deposition of two layers, namely a first sublayer 121 and a second sublayer 122, and the plasma treatment is performed after deposition of each sublayer. First, the first sublayer 121 is deposited on the principal surface of the silicon substrate 1 (FIG. 4A). Thereafter, a plasma treatment is performed (FIG. 4B). The second sublayer 122 is deposited on the first sublayer 121 (FIG. 4C), and the surface of the second sublayer is subjected to a hydrogen plasma treatment (FIG. 4D).

In one or more embodiments, the first sublayer and the second sublayer may be formed under the same deposition conditions as in deposition of the intrinsic silicon-based thin-film. By performing a plasma treatment (hereinafter, sometimes referred to as an "intermediate plasma treatment") after deposition of the first sublayer 121 on the silicon substrate 1 and before deposition of the second sublayer, the film quality of the intrinsic silicon-based thin-film can be improved. This may be because when the formation of the intrinsic silicon-based thin-film is divided into stacking a plurality of sublayers in the thickness direction, and a plasma treatment is performed after deposition of a sublayer and before deposition of a next sublayer, the effect of improving film quality by hydrogen plasma is more reliably exerted on the entire thickness portion of the intrinsic silicon-based thin-film as compared to a case where the intrinsic silicon-based thin-film is deposited at one time.

By performing the intermediate plasma treatment after deposition of the first sublayer 121 and before deposition of the second sublayer, a passivation effect by hydrogen plasma can also be exerted on a surface of the silicon substrate 1 through the first sublayer 121. In addition, the first sublayer acts as a protecting layer for reducing plasma damage to the silicon surface. Thus, the conversion characteristics of the solar cell tends to be improved by exerting a passivation effect on a surface of the silicon substrate and an effect of reducing defects at the interface between the silicon substrate and the intrinsic silicon-based thin-film while suppressing plasma damage to the silicon substrate.

The deposition thickness of each of the first sublayer 121 and the second sublayer 122 may be 8 nm or less, 6 nm or less, 5 nm or less, or 4 nm or less. By decreasing the deposition thickness of each sublayer, the film quality improving effect by hydrogen plasma can be exerted on the whole sublayer in the thickness direction. The deposition thickness of each of the first sublayer 121 and the second sublayer 122 may be 1 nm or more, 1.5 nm or more, or 2 nm or more. When the deposition thickness of each sublayer is excessively small, a coverage failure easily occurs. In addition, when the deposition thickness of each sublayer is excessively small, it is necessary to increase the number of deposition of sublayers required for forming the intrinsic silicon-based thin-film 12 having a desired thickness, so that production efficiency tends to be deteriorated. When the thickness of the first sublayer 121 is in the above-mentioned range, a passivation effect by hydrogen plasma can also be exerted on a surface of the silicon substrate 1 by the plasma treatment for the surface of the first sublayer, and plasma damage to the silicon surface can be reduced.

After the plasma treatment of the first sublayer 121, the second sublayer 122 is deposited (FIG. 4C). A plasma treatment is performed on the intrinsic silicon-based thin-film 12 including these two sublayers (FIG. 4D). When the second sublayer that is the outermost surface layer of the intrinsic silicon-based thin-film 12 is subjected to a plasma treatment, not only film quality is improved by the passivation effect on the intrinsic silicon-based thin-film, but also junction interface between the intrinsic silicon-based thin-film 12 and the conductive silicon-based thin-film 15 formed thereon tends to be improved.

Although an example in which the intrinsic silicon-based thin-film is formed by stacking two sublayers is illustrated in FIGS. 4A, 4B, 4C, and 4D, the intrinsic silicon-based thin-film may be formed by stacking three or more sublayers. When the number n of stacked sublayers (n is an integer of 2 or more) is excessively large, series resistance may increase due to an increase in thickness of the intrinsic silicon-based thin-film, leading to deterioration of the fill factor of the solar cell. In addition, when the number n of stacked sublayers is large, production efficiency of the solar cell is deteriorated. Therefore, n may be 2 to 4, 2 to 3, or n=2.

When the formation of the intrinsic silicon-based thin-film is divided into deposition of n sublayers including first to $n^{th}$ sublayers in this order from the silicon substrate side, it may be possible that after formation of any one of the first to $n^{th}$ sublayers, a plasma treatment is performed with a silicon-containing gas and hydrogen being introduced into the chamber.

When n is 3 or more, only one sublayer may be subjected to a plasma treatment, or a plurality of sublayers may be subjected to a plasma treatment. For example, when n is 3, an intermediate plasma treatment may be performed after deposition of the first sublayer, the third sublayer may be deposited without performing a hydrogen plasma treatment after deposition of the second sublayer, and the surface of the third sublayer may be subjected to a plasma treatment. In addition, a plasma treatment may be performed after deposition of the first sublayer, after deposition of the second sublayer and after deposition of the third sublayer, respectively. Plasma treatment conditions for the sublayers may be the same or different.

It may also be possible that the surface of the first sublayer of some embodiments is subjected to an intermediate plasma treatment when n is 3 or more. By subjecting to the surface of the first sublayer to an intermediate plasma treatment, the passivation effect on a surface of the silicon substrate and the effect of reducing defects at the interface between the silicon substrate and the intrinsic silicon-based thin-film tend to be improved.

[Conductive Silicon-Based Thin-Film]

A p-type silicon-based thin-film is formed, in one or more embodiments, as the conductive silicon-based thin-film 15 on the intrinsic silicon-based thin-film 12. By providing the conductive silicon-based thin-film in contact with the plasma treated intrinsic silicon-based thin-film, junction interface tends to be improved, leading to improvement of conversion characteristics. The thickness of the conductive silicon-based thin-film may be in a range of 3 nm to 20 nm.

In one or more embodiments, after the plasma treatment is performed, the p-type silicon-based thin-film 15 may be deposited in the same CVD chamber without taking out the substrate from the CVD chamber. By successively depositing the intrinsic silicon-based thin-film and the conductive silicon-based thin-film on the silicon substrate in the same CVD chamber, the process can be simplified to improve production efficiency of the solar cell. When the conductive silicon-based thin-film and the intrinsic silicon-based thin-film are deposited in the same CVD chamber, a dopant retained in the chamber may be caught in the intrinsic silicon-based thin-film. However, impurities have little influence on the passivation effect on the silicon substrate surface since impurities hardly diffuse to the silicon substrate when the intrinsic silicon-based thin-film has a thickness of 3 nm or more.

A case has been described above where the intrinsic silicon-based thin-film 12 and the p-type silicon-based thin-film 15 are formed on the silicon substrate 1 (formation of a silicon-based thin-film on the p-layer side), as an example. In the manufacturing method of one or more embodiments of the present invention, at least one of formation of the silicon-based thin-film on the p-layer side and formation of the silicon-based thin-film on the n-layer side may be performed by the above-mentioned method. Particularly, by forming the silicon-based thin-film on the p-layer side by the above-mentioned method, the conversion characteristics of the solar cell are remarkably improved. Further when both the silicon-based thin-films on the p-layer side and the n-layer side are formed by the above-mentioned method, an effect of further improving conversion characteristics can be expected.

[Transparent Electroconductive Layer]

Transparent electroconductive layers 17 and 27 are formed on the conductive silicon-based thin-films 15 and 25, respectively. The transparent electroconductive layers are made of conductive oxide. As the conductive oxide, for example, zinc oxide, indium oxide and tin oxide can be used alone or in combination. Further, an electroconductive dopant may be added to these conductive oxides. Examples of the dopant added to zinc oxide include aluminum, gallium, boron, silicon and carbon. Examples of the dopant added to indium oxide include zinc, tin, titanium, tungsten, molybdenum and silicon. Examples of the dopant added to tin oxide include fluorine. Conductive oxide layer may be deposited as a single film, or deposited as a stack of films.

The thickness of the each of the transparent electrode layers 17 and 27 may be 10 nm or more and 140 nm or less from the viewpoints of transparency and electroconductivity. It suffices that the transparent electrode layer has electroconductivity required for transportation of a carrier to the collecting electrode. If the thickness of the transparent electrode layer is too large, the transmittance may be reduced due to the absorption losses of the transparent electrode layer itself thus causing degradation of photoelectric conversion efficiency.

As the method for forming the transparent electroconductive layer, a physical vapor deposition method such as a sputtering method, chemical vapor deposition (MOCVD) using a reaction of an organic metal compound with oxygen or water, or the like may be used. In any deposition method, energy from heat, plasma discharge or the like may be used for deposition.

[Collecting Electrode]

Collecting electrodes 19 and 29 are formed on the transparent electroconductive layers 17 and 27, respectively. A metal such as silver, copper, gold, aluminum or tin is used as a material of the collecting electrode. The collecting electrode on the light-receiving side is formed in a pattern shape. The collecting electrode on the back side may be formed over the whole surface of the transparent electroconductive layer, or formed in a pattern shape. The pattern-shaped collecting electrode can be formed by application of an electroconductive paste, plating or the like. Examples of the method for applying an electroconductive paste on the transparent electroconductive layer include printing methods such as an inkjet printing method and a screen printing method, and a spray method.

[Modularization]

In one or more embodiments, the crystalline silicon-based solar cell may be modularized when put into practical use. Modularization of the solar cell is performed by an appropriate method. For example, by connecting a bus bar of the collecting electrode via an interconnector such as a TAB, a plurality of solar cells are connected in series or in parallel to form a solar cell string. A wiring for electrically connecting the solar cell or solar cell string to an external line is connected, and encapsulated with an encapsulant and a glass plate or the like to obtain a solar cell module.

In a solar cell module in which a plurality of cells are connected in series and/or in parallel, module efficiency depends on characteristics of a cell having the poorest characteristics. According to the manufacturing method of one or more embodiments of the present invention, a crystalline silicon-based solar cell having excellent conversion characteristics and a reduction of conversion characteristic variation within one batch or among batches can be attained as described above. When a plurality of cells obtained by the manufacturing method of one or more embodiments of the present invention are modularized, module efficiency can be kept high because of a reduced variation in voltage and current between cells.

EXAMPLES

Examples of one or more embodiments of the present invention will be specifically described below, but the present invention is not limited to the Examples below.

[Measurement Method]

The thickness of a thin-film formed on a silicon substrate having no texture on the surface thereof was measured using a spectroscopic ellipsometer (Model No. M2000, manufactured by J. A Woollam Co., Inc.). Fitting was performed by Tauc-Lorentz Model. The thickness of a thin-film formed on a silicon substrate having a texture on the surface thereof was determined by observing a cross-section with a transmission electron microscope (TEM). For a layer formed on a silicon substrate surface having a texture, a direction perpendicular to the slope of the texture was defined as a thickness direction.

Deposition Experimental Example: Evaluation of Thickness Variation Caused by Plasma Treatment By a plasma-enhanced CVD, an amorphous silicon thin-films were deposited on flat silicon substrates having no texture on their surfaces, and a variation in thicknesses depending on a position on a deposition tray was examined. A 200 μm-thick 6-inch n-type single-crystalline silicon wafer having a plane orientation of (100) was washed in acetone, then immersed in a 2 wt % HF aqueous solution for 3 minutes to remove a silicon oxide film on a surface of the wafer, rinsed with ultrapure water. This cleaned wafer was used as silicon substrate in the Experimental Examples below.

Experimental Example 1

(Deposition in First Batch)

A silicon substrate was mounted at each of an in-plane central portion (3,3-address) and an end portion (1,1-address) on a deposition tray (tray area: 0.93 m$^2$, deposition surface area: 0.67 m$^2$) on which 25 silicon substrates (5 (lines)×5 (rows)) were mountable. A tray having silicon substrates mounted thereon was introduced into a CVD chamber, and deposition was performed for 15 seconds under the condition of a substrate temperature of 150° C., a pressure of 120 Pa, a H$_2$/SiH$_4$ flow rate ratio of 10/3 and a power density of 11 mW/cm$^2$ (hereinafter, the condition is referred to as a "film-formation condition") to form an intrinsic silicon thin-film (first sublayer) having a thickness of about 5 nm.

After deposition of the first sublayer, plasma discharge was temporarily stopped. The supply of SiH$_4$ was stopped, and only a hydrogen gas was introduced into the CVD chamber to perform gas replacement. After gas replacement with hydrogen was performed for 30 seconds, SiH$_4$ gas was introduced into the chamber and plasma discharge was resumed. A hydrogen plasma treatment was performed under the condition of a substrate temperature of 150° C., a pressure of 520 Pa and a power density of 100 mW/cm$^2$ (hereinafter the condition is referred to as a "plasma treatment condition"). The introduction amount of the SiH$_4$ gas during the plasma treatment was adjusted so that the H$_2$/SiH$_4$ flow rate ratio was 2000/1.

After the plasma treatment was performed for 20 seconds, plasma discharge was temporarily stopped, and SiH$_4$ was introduced into the CVD chamber so that the H/SiH$_4$ flow rate ratio was set to 10/3, thereby performing gas replacement. Thereafter, plasma discharge was resumed, and deposition was performed for 15 seconds under the film-forming condition to form an intrinsic silicon thin-film (second sublayer) having a thickness of about 5 nm on the first sublayer after the plasma treatment. In this way, an intrinsic silicon thin-film including a first sublayer and a second sublayer and having a thickness of about 8 nm was formed. The reason why the thickness of the intrinsic silicon thin-film was smaller than the total deposition thickness of the first sublayer and the second sublayer is that the first sublayer was etched by the plasma treatment after deposition of the first sublayer, leading to a decrease in thickness.

After deposition of the intrinsic silicon thin-film, plasma discharge was temporarily stopped. The supply of SiH$_4$ was stopped, and thus only a hydrogen gas was introduced into the CVD chamber to perform gas replacement for about 30 seconds. Thereafter, SiH$_4$ gas was introduced into the chamber and plasma discharge was resumed to perform hydrogen plasma treatment for 20 seconds under the plasma treatment condition. As in the plasma treatment of the first sublayer, the introduction amount of the SiH$_4$ gas during the plasma treatment was adjusted so that the H$_2$/SiH$_4$ flow rate ratio was 2000/1.

On the intrinsic silicon thin-film, a p-type silicon thin-film having a thickness of about 4 nm was deposited under the condition of a substrate temperature of 150° C., a pressure of 60 Pa, a B$_2$H$_6$-containing H$_2$/SiH$_4$ flow rate ratio of 3/1 and a power density of 11 mW/cm$^2$. As B$_2$H$_6$-containing H$_2$, a mixed gas with the B$_2$H$_6$ concentration reduced to 5000 ppm by dilution with H$_2$ was used.

(Deposition in Second to Ninth Batches)

After completion of deposition in the first batch, the deposition tray was taken out from the CVD apparatus, another silicon substrate was mounted at each of the in-plane central portion and the end portion on the deposition tray, and deposition in the second batch was performed. In deposition in the second batch, a series of operations including deposition of first sublayer having a thickness of about 5 nm, plasma treatment of the first sublayer, deposition of second sublayer of about 5 nm, plasma treatment of the second sublayer, and deposition of a p-type silicon thin-film were performed as in the first batch. The series of operations were repeated until deposition in the ninth batch was completed.

(Deposition and Thickness Measurement in Tenth Batch)

In deposition in the tenth batch, deposition of first sublayer, plasma treatment of the first sublayer, deposition of second sublayer, and plasma treatment of the second sublayer were performed as in the first to ninth batches. Thereafter, the deposition tray was taken out from the CVD apparatus without forming a p-type silicon thin-film. The thickness of the intrinsic silicon thin-film in the vicinity of the center of the silicon substrate mounted at each of the central portion and the end portion of the tray was measured by spectroscopic ellipsometry.

(Deposition in 11th to 999th Batches)

A series of operations were repeated under the same condition as in the first to ninth batches to perform deposition in 11th to 999th batches.

(Deposition and Thickness Measurement in 1000th Batch)

In deposition in the 1000th batch, a first sublayer was deposited, the first sublayer was subjected to a plasma treatment, and a second sublayer was deposited, followed by taking out the deposition tray from the CVD apparatus, and measuring the thickness of the intrinsic silicon thin-film in the vicinity of the center of the silicon substrate by spectroscopic ellipsometry. The thickness was defined as a thickness d$_0$ before the plasma treatment. Thereafter, another silicon substrate was mounted at each of the in-plane central portion and the end portion on the deposition tray a first sublayer was formed, the first sublayer was subjected to a plasma treatment, a second sublayer was formed, the second sublayer was subjected to a plasma treatment, the deposition tray was taken out from the CVD apparatus, and the thickness of the intrinsic silicon thin-film in the vicinity of the center of the silicon substrate was measured by spectroscopic ellipsometry. The thickness was defined as a thickness d$_1$ after the plasma treatment.

Experiment Examples 2 to 4 and Comparative Experiment Examples 1 to 4

The introduction amount of SiH$_4$ was changed so that the H$_2$/SiH$_4$ flow rate ratio during the plasma treatment was 1000/1 (Experiment Example 2), 500/1 (Experiment Example 3), 200/1 (Experiment Example 4), 100/1 (Comparative Experiment Example 1), 50/1 (Comparative Experiment Example 2) and 3000/1 (Comparative Experiment Example 3). In Comparative Experiment Example 4, a first sublayer and a second sublayer were subjected to a plasma treatment (hydrogen plasma etching) while SiH$_4$ was not introduced, and only hydrogen was introduced. The etching rate tended to decrease with an increase in introduction amount of SiH$_4$ during the plasma treatment, and in Experiment Example 4, Comparative Experiment Example 1 and Comparative Experiment Example 2, the thickness was increased through the plasma treatment. The deposition rate during the plasma treatment was as shown in Table 1. For the deposition rate in Table 1, the positive sign means deposition, and the negative sign means etching.

In these Experiment Examples, the deposition time of the intrinsic silicon-based thin-film was changed so that the thickness d$_1$ after the plasma treatment was equivalent to that in Experiment Example 1. The deposition time of the first sublayer and the second sublayer was 12 seconds in Experiment Example 2, 10 seconds in Experiment Example 3, 9 seconds in Experiment Example 4, 7 seconds in Comparative Experiment Example 1 and 6 seconds in Comparative Experiment Example 2, 21 seconds in Comparative Experiment Example 3 and 26 seconds in Comparative Experiment Example 4. The total deposition time of the first sublayer and the second sublayer in each Experiment Example is shown in Table 2.

Deposition of a silicon thin-film on a silicon substrate was repeated in the same manner as in Experiment Example 1 except that the deposition time of the intrinsic silicon thin-film and the $SiH_4$ introduction amount during the plasma treatment were changed as described above. The thicknesses of each of intrinsic silicon thin-films in the tenth and 1000th batches was measured.

Experiment Example 5

The power density during the plasma treatment was changed to 30 mW/cm², and the deposition time of the first sublayer and the second sublayer was changed to 11 seconds. Deposition of a silicon thin-film on a silicon substrate was repeated in the same manner as in Experiment Example 1 except that the above-mentioned changes were made. The thicknesses of each of intrinsic silicon thin-films in the tenth and 1000th batches was measured.

Comparative Experiment Example 5

The power density during the plasma treatment was changed to 30 mW/cm², and the deposition time of the first sublayer and the second sublayer was changed to 17 seconds. Deposition of a silicon thin-film on a silicon substrate and a hydrogen plasma etching were repeated in the same manner as in Comparative Experiment Example 4 except that the above-mentioned changes were made. The thickness of each of intrinsic silicon thin-films in the tenth and 1000th batches was measured.

Experiment Example 6

Deposition was performed under film-formation condition for 25 seconds to form an intrinsic silicon thin-film having a thickness of about 8 nm, and plasma discharge was temporarily stopped thereafter. The supply of $SiH_4$ was stopped, and only a hydrogen gas was introduced into the CVD chamber to perform gas replacement. After replacement with hydrogen was performed for 30 seconds, $SiH_4$ was supplied into the chamber, and plasma discharge was resumed to perform a plasma treatment for 20 seconds. The introduction amount of the $SiH_4$ gas during the plasma treatment was adjusted so that the $H_2/SiH_4$ flow rate ratio was 2000/1. Thereafter, a p-type silicon thin-film was deposited on the intrinsic silicon thin-film. In other words, in Experiment Example 6, a plasma treatment (intermediate plasma treatment) in the middle of deposition of the amorphous silicon thin-film was not performed, and after deposition and a plasma treatment were each performed once, a p-layer was deposited. The series of operations were repeated to measure the thickness of each of intrinsic silicon thin-films in the tenth and 1000th batches.

Comparative Experiment Example 6

Deposition was performed under film-formation condition for 20 seconds to form an intrinsic silicon thin-film having a thickness of about 6 nm. Thereafter, a p-type silicon thin-film was deposited on the intrinsic silicon thin-film without performing a plasma treatment. The series of operations were repeated to measure the thickness of each of intrinsic silicon thin-films in the tenth and 1000th batches.

<Evaluation Results>

Table 1 shows the hydrogen dilution ratio, power density pressure, substrate temperature and deposition rate under "film-formation condition" and "plasma treatment conditions" in a list.

TABLE 1

|  | $H_2/SiH_4$ | Power density (mW/cm²) | Pressure (Pa) | Substrate temperature (° C.) | Deposition rate (nm/sec) |
|---|---|---|---|---|---|
| Film-formation conditions | 3.3 | 11 | 120 | 150 | 0.23 |
| Plasma treatment conditions | 3000 | 100 | 520 |  | −0.20 |
|  | 2000 |  |  |  | −0.08 |
|  | 1000 |  |  |  | −0.06 |
|  | 500 |  |  |  | 0 |
|  | 200 |  |  |  | 0.05 |
|  | 100 |  |  |  | 0.09 |
|  | 50 |  |  |  | 0.13 |
|  | ∞ |  |  |  | −0.28 |
|  | 2000 | 30 |  |  | −0.03 |
|  | ∞ |  |  |  | −0.10 |

Table 2 shows deposition time (total deposition time when the first sublayer and the second sublayer are deposited), presence or absence of the intermediate plasma treatment and plasma treatment conditions, and thickness measurement results in Experimental Examples and Comparative Experimental Examples. For the thicknesses variation within one batch, a difference between a thickness (Te) of an intrinsic silicon thin-film deposited on a substrate at a tray end portion and a thickness (Tc) of an intrinsic silicon thin-film deposited on a substrate at a tray central portion in each batch is expressed in terms of a percentage. For the thicknesses variation among batches, a difference between a thickness ($T_{10}$) in the tenth batch and a thickness ($T_{1000}$) in the 1000th batch is expressed in terms of a percentage.

thickness variation within batch (%)=100×(Te−Tc)/Tc thickness variation among batches (%)=100×($T_{10}$−$T_{1000}$)/$T_{1000}$

TABLE 2

|  | Deposition Total deposition time (seconds) Intermediate plasma treatment | Plasma treatment $H_2/SiH_4$ Power density (mW/cm²) | Substrate position | Film thickness measurement results | | | | Variation in thickness $d_1$ among batches (%) |
|---|---|---|---|---|---|---|---|---|
|  |  |  |  | Tenth batch | 1000th batch | | | |
|  |  |  |  | $d_1$ | $d_0$ | $d_1$ | $d_1 − d_0$ | |
| Experiment Example 1 | 30 | 2000 | End portion (nm) | 6.15 | 7.73 | 6.12 | −1.61 | 0.5 |
|  |  |  | Central portion (nm) | 6.13 | 7.72 | 6.10 | −1.62 | 0.5 |
|  | Done | 100 | Thickness variation within batch (%) | 0.3 | 0.1 | 0.3 |  |  |

TABLE 2-continued

| | Deposition Total deposition time (seconds) Intermediate plasma treatment | Plasma treatment $H_2/SiH_4$ Power density (mW/cm²) | Substrate position | Film thickness measurement results | | | | Variation in thickness $d_1$ among batches (%) |
|---|---|---|---|---|---|---|---|---|
| | | | | Tenth batch $d_1$ | 1000th batch $d_0$ | $d_1$ | $d_1 - d_0$ | |
| Experiment Example 2 | 24 | 1000 | End portion (nm) | 6.16 | 7.38 | 6.16 | −1.22 | 0.0 |
| | | | Central portion (nm) | 6.14 | 7.39 | 6.13 | −1.26 | 0.2 |
| | Done | 100 | Thickness variation within batch (%) | 0.3 | −0.1 | 0.5 | | |
| Experiment Example 3 | 20 | 500 | End portion (nm) | 6.18 | 6.19 | 6.18 | −0.01 | 0.0 |
| | | | Central portion (nm) | 6.19 | 6.19 | 6.20 | 0.01 | −0.2 |
| | Done | 100 | Thickness variation within batch (%) | 0.2 | 0.0 | 0.3 | | |
| Example 4 | 18 | 200 | End portion (nm) | 6.21 | 5.22 | 6.20 | 0.98 | 0.2 |
| | | | Central portion (nm) | 6.23 | 5.18 | 6.21 | 1.03 | 0.3 |
| | Done | 100 | Thickness variation within batch (%) | 0.3 | 0.8 | 0.2 | | |
| Comparative Experiment Example 1 | 14 | 100 | End portion (nm) | 6.10 | 4.38 | 6.19 | 1.81 | −1.5 |
| | | | Central portion (nm) | 6.19 | 4.46 | 6.27 | 1.81 | −1.3 |
| | Done | 100 | Thickness variation within batch (%) | 1.5 | −1.8 | 1.3 | | |
| Comparative Experiment Example 2 | 12 | 50 | End portion (nm) | 6.11 | N.D. | 6.12 | | −0.2 |
| | | | Central portion (nm) | 6.18 | | 6.29 | | −1.7 |
| | Done | 100 | Thickness variation within batch (%) | 1.1 | | 2.7 | | |
| Comparative Experiment Example 3 | 42 | 3000 | End portion (nm) | 6.24 | N.D. | 6.19 | | 0.8 |
| | | | Central portion (nm) | 6.01 | | 5.52 | | 8.9 |
| | Done | 100 | Thickness variation within batch (%) | 3.8 | | 12.1 | | |
| Comparative Experiment Example 4 | 52 | ∞ | End portion (nm) | 6.17 | 11.1 | 6.11 | −4.99 | 1.0 |
| | | | Central portion (nm) | 6.15 | 11.0 | 5.31 | −5.69 | 15.8 |
| | Done | 100 | Thickness variation within batch (%) | 0.3 | 0.9 | 15.1 | | |
| Experiment Example 5 | 22 | 2000 | End portion (nm) | 6.17 | 6.70 | 6.11 | −0.59 | 1.0 |
| | | | Central portion (nm) | 6.11 | 6.68 | 6.07 | −0.61 | 0.7 |
| | Done | 30 | Thickness variation within batch (%) | 1.0 | 0.3 | 0.7 | | |
| Comparative Experiment Example 5 | 34 | ∞ | End portion (nm) | 6.17 | N.D. | 6.11 | | 1.0 |
| | | | Central portion (nm) | 6.10 | | 5.63 | | 8.3 |
| | Done | 30 | Thickness variation within batch (%) | 1.1 | | 8.5 | | |
| Experiment Example 6 | 25 | 2000 | End portion (nm) | 6.17 | 7.71 | 6.12 | −1.59 | 0.8 |
| | | | Central portion (nm) | 6.15 | 7.72 | 6.10 | −1.62 | 0.8 |
| | Not done | 100 | Thickness variation within batch (%) | 0.3 | −0.1 | 0.3 | | |
| Comparative Experiment Example 6 | 20 | — | End portion (nm) | 6.23 | N.D. | 6.08 | | 2.5 |
| | | | Central portion (nm) | 6.19 | | 6.03 | | 2.7 |
| | Not Done | | Thickness variation within batch (%) | 0.6 | | 0.8 | | |

As shown in Table 1, it is apparent that the etching rate is high in a plasma treatment (hydrogen plasma etching) in which only hydrogen is introduced, whereas the etching rate decreases when $SiH_4$ is introduced in addition to hydrogen. When the plasma power density is 100 mW/cm², the deposition rate becomes positive (deposition mode) by setting the hydrogen dilution ratio 500 or less. In addition, it is apparent that from comparison between a case where the power density is 100 mW/cm² during the plasma treatment (Experiment Example 1) and a case where the power density is 30 mW/cm² during the plasma treatment (Experiment Example 5), the deposition rate decreases (the etching rate increases) as the power density increases. These results show that the deposition rate (etching rate) can be arbitrarily adjusted by adjusting the $H_2/SiH_4$ flow rate ratio and the plasma power density during the plasma treatment.

The results in Table 2 show that in Comparative Experiment Examples 4 and 5 where only hydrogen was introduced during the plasma treatment, the amount of thickness decrease at the central portion by the plasma treatment was large, and thus the thickness variation within one batch was markedly increased in the 1000th batch. In Comparative Experiment Example 3 where the $H_2/SiH_4$ flow rate ratio during the plasma treatment was 3000/1, the amount of thickness decrease at the central portion by the plasma treatment was large, and thus the thickness variation within one batch was markedly increased in the 1000th batch.

On the other hand, in Experiment Examples 1 to 4 where the $H_2/SiH_4$ flow rate ratio during the plasma treatment was 200/1 to 2000/1, the thickness variation within one batch was about 1% or less in the 1000th batch. In Comparative Experiment Examples 1 and 2 where the $SiH_4$ flow rate was further increased, the amount of thickness increase at the central portion was large, and thus the thickness variation within one batch was more than 1% in the 1000th batch.

These results show that the thickness variation of the intrinsic silicon thin-film when the number of continuous deposition batches is increased tends to decrease as the deposition rate (etching rate) during the plasma treatment becomes closer to 0.

Preparation Example of Solar Cell

<Formation of Texture on Silicon Substrate>

A 200 μm-thick 6-inch n-type single-crystalline silicon wafer having a plane orientation of (100) was washed in acetone, then immersed in a 2 wt % HF aqueous solution for 3 minutes to remove a silicon oxide film on a surface of the wafer, and rinsed with ultrapure water. The washed silicon substrate was immersed in a 5/15 wt % KOH/isopropyl alcohol aqueous solution at 70° C. for 15 minutes, and rinsed with ultrapure water to obtain a single-crystalline silicon substrate with pyramidal texture having a (111) plane exposed on its surface.

In the following Examples and Comparative Examples, a silicon thin-film was formed, under the same condition as in the Experimental Examples and Comparative Experimental Examples, on silicon substrate having texture thereon. In Examples and Comparative Examples, the time for deposition of the silicon thin-film and the plasma treatment was set to 1.5 times that in the Experimental Examples and Comparative Experimental Examples in consideration of the fact that the surface area of a substrate having texture on a silicon substrate surface is about 1.5 times the surface area of the substrate before formation of the texture.

Example 1

(CVD Film Formation on p-Layer Side)

A textured silicon substrate was mounted at each of an in-plane central portion (3,3-address) and an end portion (1,1-address) on a deposition tray on which 25 silicon substrates (5 (lines)×5 (rows)) were mountable. A tray with a silicon substrate mounted thereon was introduced into a CVD chamber, and on the silicon substrate, deposition of about 5 nm-thick first sublayer under the film-formation condition, plasma treatment of the first sublayer under the plasma treatment condition, deposition of about 5 nm-thick second sublayer, plasma treatment of the second sublayer, and deposition of a p-type silicon thin-film were performed under the same condition as in Experimental Example 1. The tray was replaced, and deposition was performed in 1000 batches under the same condition as described above.

(Preparation of Solar Cell)

Among substrates on which the silicon thin-film was formed on the p-layer side, four substrates in the tenth batch and the 1000th batch were taken out, and a heterojunction solar cell was prepared. An intrinsic silicon thin-film having a thickness of 6 nm was deposited on a silicon thin-film-non-formed surface (back side) of the silicon substrate under the film-formation condition, and an n-type silicon thin-film having a thickness of about 4 nm was deposited thereon under the condition of a substrate temperature of 150° C., a pressure of 60 Pa, a $PH_3$-containing $H_2/SiH_4$ flow rate ratio of 3/1 and a power density of 11 mW/cm$^2$. As $PH_3$-containing $H_2$, a mixed gas with the $PH_3$ concentration reduced to 5000 ppm by dilution with $H_2$ was used.

An ITO transparent electroconductive film having a thickness of 80 nm was deposited on each of the n-type silicon thin-film and the p-type silicon thin-film. The transparent electroconductive film was deposited under the condition of a substrate temperature of 150° C., an argon/oxygen flow rate of 50 sccm/1 sccm, a pressure of 0.2 Pa and a power density of 0.5 W/cm$^2$ by a sputtering method using an ITO sintered target having a tin oxide content of 5% by weight. A silver paste was applied in a comb shape on the transparent electroconductive layer by screen printing, and heated at 150° C. for 1 hour to obtain a solar cell for evaluation.

Examples 2 to 6 and Comparative Examples 1 to 6

The condition for CVD film formation on the p-layer side was changed to the same condition as in Experimental Examples 2 to 6 and Comparative Experimental Examples 1 to 6 (the time for deposition and plasma treatment of the silicon thin-film was 1.5 times as much as that in the Experimental Examples and Comparative Experimental Examples). Deposition was performed in 1000 batches in the same manner as in Example 1 except for the above, and solar cells for evaluation were prepared using the substrates in the tenth batch and the 1000th batch.

<Evaluation Results>

The power generation characteristics of the solar cell obtained in each of Examples and Comparative Examples were measured under photoirradiation with an AM of 1.5 and 100 mW/cm$^2$ at a temperature of 25° C. In Table 3, the open circuit voltage (Voc), the short circuit current (Isc), the fill factor (FF) and the maximum power (Pmax) are each shown as a relative value where the value for a cell in the tenths batch (a cell obtained by performing deposition at the tray end portion) in Comparative Example 6 is set to 1. The "difference" in Table 3 is a difference between the value at the end portion and the value at the central portion in the same batch, and ΔPmax is a difference between Pmax of the cell in the tenth batch and Pmax of the cell in the 1000th batch.

TABLE 3

| | Deposition Total deposition time (seconds) Intermediate plasma treatment | Plasma treatment $H_2/SiH_4$ Power density (mW/cm$^2$) | Substrate position | Conversion characteristics (relative values) | | | | | | | | |
|---|---|---|---|---|---|---|---|---|---|---|---|---|
| | | | | Tenth batch | | | | 1000th batch | | | | |
| | | | | Voc | Isc | FF | Pmax | Voc | Isc | FF | Pmax | ΔPmax |
| Example 1 | 30 | 2000 | End portion | 1.053 | 1.011 | 1.021 | 1.087 | 1.051 | 1.008 | 1.023 | 1.084 | 0.003 |
| | | | Central portion | 1.052 | 1.010 | 1.022 | 1.086 | 1.051 | 1.008 | 1.024 | 1.085 | 0.001 |
| | Done | 100 | Difference | 0.001 | 0.001 | −0.001 | 0.001 | 0.000 | 0.000 | −0.001 | −0.001 | |

TABLE 3-continued

| | Deposition Total deposition time (seconds) Intermediate plasma treatment | Plasma treatment $H_2/SiH_4$ Power density $(mW/cm^2)$ | Substrate position | Conversion characteristics (relative values) | | | | | | | | |
|---|---|---|---|---|---|---|---|---|---|---|---|---|
| | | | | Tenth batch | | | | 1000th batch | | | | |
| | | | | Voc | Isc | FF | Pmax | Voc | Isc | FF | Pmax | ΔPmax |
| Example 2 | 24 | 1000 | End portion | 1.056 | 1.010 | 1.022 | 1.090 | 1.054 | 1.010 | 1.024 | 1.090 | 0.000 |
| | | | Central portion | 1.053 | 1.008 | 1.022 | 1.085 | 1.052 | 1.009 | 1.025 | 1.088 | −0.003 |
| | Done | 100 | Difference | 0.003 | 0.002 | 0.000 | 0.005 | 0.002 | 0.001 | −0.001 | 0.002 | |
| Example 3 | 20 | 500 | End portion | 1.055 | 1.007 | 1.026 | 1.090 | 1.055 | 1.007 | 1.025 | 1.089 | 0.001 |
| | | | Central portion | 1.053 | 1.008 | 1.027 | 1.090 | 1.056 | 1.007 | 1.027 | 1.092 | −0.002 |
| | Done | 100 | Difference | 0.002 | −0.001 | −0.001 | 0.000 | −0.001 | 0.000 | −0.002 | −0.003 | |
| Example 4 | 18 | 200 | End portion | 1.056 | 1.006 | 1.018 | 1.081 | 1.056 | 1.006 | 1.018 | 0.081 | 0.000 |
| | | | Central portion | 1.053 | 1.008 | 1.015 | 1.077 | 1.056 | 1.008 | 1.016 | 0.081 | −0.004 |
| | Done | 100 | Difference | 0.003 | −0.002 | 0.003 | 0.004 | 0.000 | −0.002 | 0.002 | 0.000 | |
| Comparative Example 1 | 14 | 100 | End portion | 1.034 | 1.007 | 1.008 | 1.050 | 1.037 | 1.005 | 1.006 | 1.048 | 0.001 |
| | | | Central portion | 1.039 | 1.004 | 1.009 | 1.053 | 1.041 | 1.003 | 1.009 | 1.054 | −0.001 |
| | Done | 100 | Difference | −0.005 | 0.003 | −0.001 | −0.003 | −0.004 | 0.002 | −0.003 | −0.005 | |
| Comparative Example 2 | 12 | 50 | End portion | 1.025 | 1.007 | 1.006 | 1.038 | 1.026 | 1.005 | 1.006 | 1.037 | 0.001 |
| | | | Central portion | 1.028 | 1.004 | 1.003 | 1.035 | 1.030 | 1.003 | 1.003 | 1.036 | −0.001 |
| | Done | 100 | Difference | −0.003 | 0.003 | 0.003 | 0.003 | −0.004 | 0.002 | 0.003 | 0.001 | |
| Comparative Example 3 | 42 | 3000 | End portion | 1.062 | 1.013 | 1.019 | 1.096 | 1.041 | 1.009 | 1.015 | 1.066 | 0.030 |
| | | | Central portion | 1.063 | 1.011 | 1.021 | 1.097 | 1.019 | 1.011 | 1.007 | 1.037 | 0.060 |
| | Done | 100 | Difference | −0.001 | 0.002 | −0.002 | −0.001 | 0.022 | −0.002 | 0.008 | 0.029 | |
| Comparative Example 4 | 52 | ∞ | End portion | 1.065 | 1.014 | 1.019 | 1.100 | 1.048 | 1.004 | 1.015 | 1.088 | 0.032 |
| | | | Central portion | 1.053 | 1.011 | 1.025 | 1.091 | 1.015 | 1.004 | 1.008 | 1.027 | 0.064 |
| | Done | 100 | Difference | 0.012 | 0.003 | −0.006 | 0.009 | 0.033 | 0.000 | 0.007 | 0.041 | |
| Example 5 | 22 | 2000 | End portion | 1.029 | 1.011 | 1.015 | 1.056 | 1.028 | 1.011 | 1.019 | 1.059 | −0.003 |
| | | | Central portion | 1.030 | 1.010 | 1.019 | 1.060 | 1.028 | 1.012 | 1.017 | 1.058 | 0.002 |
| | Done | 30 | Difference | −0.001 | 0.001 | −0.004 | −0.004 | 0.000 | −0.001 | 0.002 | 0.001 | |
| Comparative Example 5 | 34 | ∞ | End portion | 1.025 | 1.014 | 1.013 | 1.053 | 1.025 | 1.004 | 1.015 | 1.045 | 0.008 |
| | | | Central portion | 1.019 | 1.011 | 1.017 | 1.048 | 1.015 | 1.014 | 1.009 | 1.039 | 0.009 |
| | Done | 30 | Difference | 0.006 | 0.003 | −0.004 | 0.005 | 0.010 | −0.010 | 0.006 | 0.006 | |
| Example 6 | 25 | 2000 | End portion | 1.039 | 1.009 | 1.022 | 1.071 | 1.039 | 1.008 | 1.023 | 1.071 | 0.000 |
| | | | Central portion | 1.040 | 1.010 | 1.022 | 1.074 | 1.039 | 1.011 | 1.022 | 1.074 | 0.000 |
| | Not done | 100 | Difference | −0.001 | −0.001 | 0.000 | −0.002 | 0.000 | −0.003 | 0.001 | −0.002 | |
| Comparative Example 6 | 20 | — | End portion | 1 | 1 | 1 | 1 | 0.999 | 1.000 | 1.002 | 1.001 | −0.001 |
| | | | Central portion | 0.989 | 1.008 | 1.004 | 1.001 | 0.989 | 1.008 | 1.001 | 0.998 | 0.003 |
| | Not done | | Difference | 0.011 | −0.008 | −0.004 | −0.001 | 0.010 | −0.008 | 0.001 | 0.003 | |

Comparison among cells in the tenth batch in Examples and Comparative Examples shows that in Examples 1 to 6 and Comparative Examples 1 to 5 where the plasma treatment was performed, higher Pmax was exhibited, and conversion characteristics were improved by the plasma treatment as compared to Comparative Example 6 where the plasma treatment was not performed. In particular, conversion efficiency was remarkably improved in Examples 1 to 4 and Comparative Examples 3 and 4 where the first sublayer was subjected to an intermediate plasma treatment and the second sublayer was subjected to a plasma treatment at a plasma power of 100 mW/cm² with hydrogen introduced in an amount of not less than 200 times the amount of silane. In each of Examples and Comparative Examples, the difference in Pmax between the cell at the end portion and the cell at the central portion in the same batch was about 1% or less, and there was no significant variation in conversion efficiency within the same batch.

In Comparative Examples 4 and 5 where only hydrogen was introduced during the plasma treatment, the cell in the tenth batch had high conversion efficiency but the conversion characteristics of the cell in the 1000th batch were markedly deteriorated. In particular, the cell at the central portion has high ΔPmax, and there is a large variation in characteristics within one batch and among batches. In other words, although the characteristics of the cell in the initial batch of deposition can be improved by subjecting the intrinsic silicon thin-film to the hydrogen plasma etching, the characteristics of the cell are deteriorated with an increase in the number of continuous deposition batches, and a characteristic variation within one batch is increased. In Comparative Example 3 where the $H_2/SiH_4$ flow rate ratio during the plasma treatment was 3000/1, there was a large variation in characteristics within one batch and among batches as in Comparative Examples 4 and 5.

On the other hand, it is apparent that in Examples 1 to 6 where the H$_2$/SiH$_4$ flow rate ratio during the plasma treatment was 200/1 to 2000/1, the cell in the 1000th batch retained high conversion characteristics, and the variation in characteristics within one batch was small.

Comparison of the thickness evaluation results in Table 2 with the results of evaluation of conversion characteristics in Table 3 shows that there is a high correlation between a variation in thickness of the intrinsic silicon thin-films in each of Experiment Examples and Comparative Experiment Examples (Table 2) and a variation in characteristics of the solar cell in each of Examples and Comparative Examples (Table 3). That is, in Comparative Examples, the thickness variation increases with an increase in the number of continuous deposition batches, and accordingly a variation in characteristics occurs. On the other hand, it is apparent that in Examples, the distribution of the thickness of the intrinsic silicon thin-film within one batch and among batches is reduced while the passivation effect by the plasma treatment is maintained, so that the effect of improving conversion characteristics by the plasma treatment can be maintained even when the number of continuous deposition batches is increased.

In Comparative Examples 1 and 2 where the SiH$_4$ introduction amount during the plasma treatment is large (hydrogen dilution ratio is small), the thickness variation in the 1000th batch is smaller, and the variation in conversion characteristics is smaller as compared to Comparative Examples 4 and 5. However, in both the tenth batch and the 1000th batch, the conversion characteristics are low, and the effect of improving characteristics by the plasma treatment is not sufficient. This may be because the deposition rate in the plasma treatment is high, and thus deposition of the silicon thin-film may occur more preferentially than penetration of hydrogen plasma into the intrinsic silicon-based thin-film, so that the passivation effect by hydrogen plasma is low, leading to insufficient improvement of Voc. In addition, formation of a high-hydrogen-concentration interface layer in a significant thickness by plasma treatment may be a factor of hindering improvement of conversion characteristics.

Comparison between Example 1 and Example 6 shows that in Example 1 where an intermediate plasma treatment was performed, a higher open circuit voltage was exhibited in both the tenth batch and the 1000th batch. This may be because the intermediate plasma treatment of the surface of the silicon thin-film (first sublayer) having a smaller thickness contributed to improvement of interface characteristics between the intrinsic silicon thin-film and the silicon substrate, and improvement of the film quality of the intrinsic silicon thin-film in the vicinity of the silicon substrate.

In Example 5 where the power density during plasma treatment was 30 mW/cm$^2$, the thickness variation in the 1000th batch was small, and higher conversion characteristics were exhibited as compared to Comparative Examples 1 and 2. On the other hand, it is apparent that conversion characteristics in Example 5 were lower than those in Example 1. This may be because in Example 5, the power density during the plasma treatment is low, and the passivation effect by hydrogen plasma is small.

The above-mentioned results show that by appropriately adjusting the introduction amount of the silicon-containing gas (hydrogen dilution ratio) and the plasma power density during the plasma treatment, a solar cell excellent in conversion efficiency can be obtained. In addition, it is apparent that a variation in conversion characteristics occurs with an increase in the number of batches of continuous deposition of the silicon-based thin-film when a hydrogen plasma etching is performed, whereas a variation in cell characteristics within one batch and among batches can be reduced by introducing a silicon-containing gas in the plasma treatment.

Although the disclosure has been described with respect to only a limited number of embodiments, those skilled in the art, having benefit of this disclosure, will appreciate that various other embodiments may be devised without departing from the scope of the present invention. Accordingly the scope of the invention should be limited only by the attached claims.

What is claimed is:

1. A method for manufacturing a crystalline silicon-based solar cell comprising a conductive single-crystalline silicon substrate, an intrinsic silicon-based thin-film, and a conductive silicon-based thin-film, the method comprising:
    disposing a plurality of conductive single-crystalline silicon substrates, each provided with an intrinsic silicon-based thin-film on a surface thereof, in a chemical vapor deposition (CVD) chamber; and
    performing a plasma treatment by introducing a hydrogen gas and a silicon-containing gas into the CVD chamber, wherein a surface of the intrinsic silicon-based thin-film is exposed to a hydrogen plasma,
    wherein an amount of the hydrogen gas introduced into the CVD chamber during the plasma treatment is 150 to 2500 times an amount of the silicon-containing gas introduced into the CVD chamber, and
    a power density during the plasma treatment is 55 to 1000 mW/cm$^2$.

2. The method according to claim 1, wherein
    a product of a power density during the plasma treatment and a ratio of the amount of the hydrogen gas to the amount of the silicon-containing gas is 15000 to 250000 mW/cm$^2$.

3. The method according to claim 1, wherein
    a difference $d_1-d_0$ is −3 nm to +1.5 nm, wherein $d_1$ is a thickness of the intrinsic silicon-based thin-film after the plasma treatment and $d_0$ is a thickness of the intrinsic silicon-based thin-film before the plasma treatment.

4. The method according to claim 3, wherein a value of $(d_1-d_0)/d_1$ is −0.4 to +0.2.

5. The method according to claim 1, wherein
    a deposition rate of the intrinsic silicon-based thin-film in the plasma treatment is −0.14 nm/second to +0.08 nm/second.

6. The method according to claim 1, further comprising forming the intrinsic silicon-based thin-film by plasma-enhanced CVD with a silicon-containing gas and a hydrogen gas introduced into a CVD chamber,
    wherein an amount of the hydrogen gas introduced into the CVD chamber during the formation of the intrinsic silicon-based thin-film is less than 50 times an amount of the silicon-containing gas introduced into the CVD chamber.

7. The method according to claim 6, wherein
    a deposition rate during the formation of the intrinsic silicon-based thin-film is 0.1 nm/sec or more, wherein the deposition rate is calculated as a deposition rate on a smooth surface.

8. The method according to claim 6, wherein
    the formation of the intrinsic silicon-based thin-film and the plasma treatment are performed in the same CVD chamber.

9. The method according to claim 6, wherein
forming the intrinsic silicon-based thin-film is performed by stacking, in the following order, first to $n^{th}$ sublayers on the conductive single-crystalline silicon substrate,
n is an integer of 2 or more, and
the plasma treatment is performed after formation of one of the sublayers.

10. The method according to claim 9, wherein the plasma treatment is performed after formation of the first sublayer.

11. The method according to claim 9, wherein the plasma treatment is performed after formation of the $n^{th}$ sublayer.

12. The method according to claim 9, wherein n=2.

13. The method according to claim 9, wherein each of the sublayers has a thickness of 1 to 8 nm.

14. The method according to claim 9, wherein the first sublayer has a thickness of 1 to 6 nm.

15. A method for manufacturing a crystalline silicon-based solar cell comprising a conductive single-crystalline silicon substrate, an intrinsic silicon-based thin-film, and a conductive silicon-based thin-film, the method comprising:
disposing a plurality of conductive single-crystalline silicon substrates, each provided with an intrinsic silicon-based thin-film on a surface thereof, in a chemical vapor deposition (CVD) chamber; and
performing a plasma treatment by introducing a hydrogen gas and a silicon-containing gas into the CVD chamber, wherein a surface of the intrinsic silicon-based thin-film is exposed to a hydrogen plasma,
wherein an amount of the hydrogen gas introduced into the CVD chamber during the plasma treatment is 150 to 2500 times an amount of the silicon-containing gas introduced into the CVD chamber, and
wherein a difference $d_1-d_0$ is −3 nm to +1.5 nm, wherein $d_1$ is a thickness of the intrinsic silicon-based thin-film after the plasma treatment and $d_0$ is a thickness of the intrinsic silicon-based thin-film before the plasma treatment.

16. The method according to claim 15, wherein a value of $(d_1-d_0)/d_1$ is −0.4 to +0.2.

17. The method according to claim 15, wherein
a product of a power density during the plasma treatment and a ratio of the amount of the hydrogen gas to the amount of the silicon-containing gas is 15000 to 250000 mW/cm$^2$.

18. A method for manufacturing a crystalline silicon-based solar cell comprising a conductive single-crystalline silicon substrate, an intrinsic silicon-based thin-film, and a conductive silicon-based thin-film, the method comprising:
disposing a plurality of conductive single-crystalline silicon substrates, each provided with an intrinsic silicon-based thin-film on a surface thereof, in a chemical vapor deposition (CVD) chamber; and
performing a plasma treatment by introducing a hydrogen gas and a silicon-containing gas into the CVD chamber, wherein a surface of the intrinsic silicon-based thin-film is exposed to a hydrogen plasma,
wherein an amount of the hydrogen gas introduced into the CVD chamber during the plasma treatment is 150 to 2500 times an amount of the silicon-containing gas introduced into the CVD chamber, and
wherein a deposition rate of the intrinsic silicon-based thin-film in the plasma treatment is −0.14 nm/second to +0.08 nm/second.

19. The method according to claim 18, wherein
a product of a power density during the plasma treatment and a ratio of the amount of the hydrogen gas to the amount of the silicon-containing gas is 15000 to 250000 mW/cm$^2$.

* * * * *